(12) United States Patent
Tsuruoka

(10) Patent No.: US 9,921,350 B2
(45) Date of Patent: Mar. 20, 2018

(54) GRID POLARIZATION ELEMENT, AND OPTICAL ALIGNMENT DEVICE

(71) Applicant: USHIO DENKI KABUSHIKI KAISHA, Tokyo (JP)

(72) Inventor: Kazuyuki Tsuruoka, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/514,726

(22) PCT Filed: Sep. 29, 2015

(86) PCT No.: PCT/JP2015/077634
§ 371 (c)(1),
(2) Date: Mar. 27, 2017

(87) PCT Pub. No.: WO2016/052576
PCT Pub. Date: Apr. 7, 2016

(65) Prior Publication Data
US 2017/0242171 A1    Aug. 24, 2017

(30) Foreign Application Priority Data

Sep. 30, 2014    (JP) ................. 2014-200157

(51) Int. Cl.
*G02B 5/30* (2006.01)
*G03B 27/72* (2006.01)
*G02F 1/13* (2006.01)
*G02F 1/1337* (2006.01)
*G03F 7/20* (2006.01)

(52) U.S. Cl.
CPC ......... *G02B 5/3058* (2013.01); *G02B 5/3075* (2013.01); *G02F 1/1303* (2013.01); *G02F 1/133788* (2013.01); *G03F 7/70566* (2013.01)

(58) Field of Classification Search
CPC ... G02B 5/3058; G02B 5/3075; G02F 1/1303; G02F 1/133788; G02F 2001/133548; G03F 7/70566
USPC ............ 349/96; 355/71; 359/485.03, 485.05, 359/487.03
See application file for complete search history.

(56) References Cited

U.S. PATENT DOCUMENTS

2009/0041971 A1    2/2009  Wang et al.
2009/0053655 A1    2/2009  Deng et al.
2009/0153961 A1    6/2009  Murakami et al.

FOREIGN PATENT DOCUMENTS

EP    1 909 121 A1    4/2008
JP    2007-017762 A    1/2007
(Continued)

OTHER PUBLICATIONS

International Search Report issued in PCT/JP2015/077634; dated Dec. 15, 2015.

*Primary Examiner* — Colin Kreutzer
(74) *Attorney, Agent, or Firm* — Studebaker & Brackett PC

(57) ABSTRACT

An absorptive grid polarization element includes a transparent substrate, and a stripe-like grid provided on the transparent substrate. Each of a plurality of linear parts which form the grid absorbs more s polarization light than p polarization light, and thus achieves a polarizing action. The transparent substrate is made of quartz glass. Each of the linear parts includes a second layer formed on the transparent substrate, and a first layer formed on the second layer. The first layers are formed from amorphous titanium oxide. The second layers are formed from amorphous silicon.

13 Claims, 9 Drawing Sheets

(56) References Cited

FOREIGN PATENT DOCUMENTS

| | | |
|---|---|---|
| JP | 2007-033558 A | 2/2007 |
| JP | 2010-501085 A | 1/2010 |
| JP | 2015-064426 A | 4/2015 |
| WO | 2007/011047 A1 | 1/2007 |
| WO | 2008/022097 A2 | 2/2008 |
| WO | 2008/022099 A2 | 2/2008 |

FIG. 8
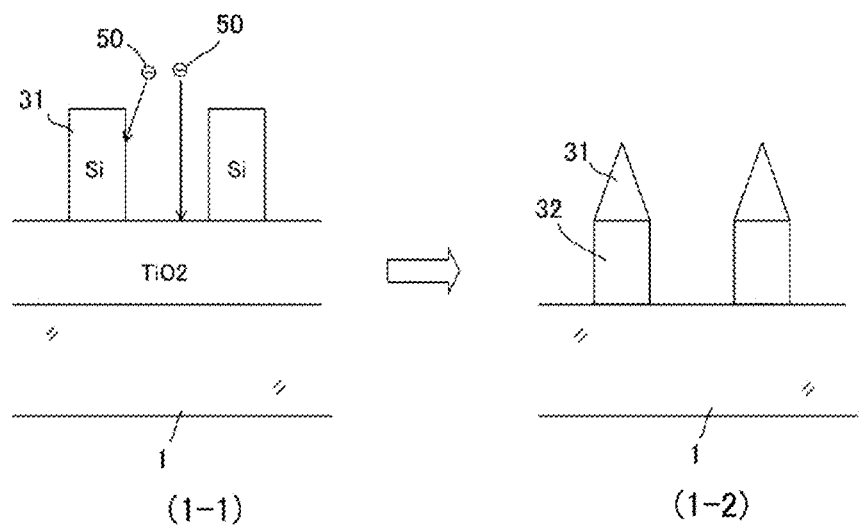
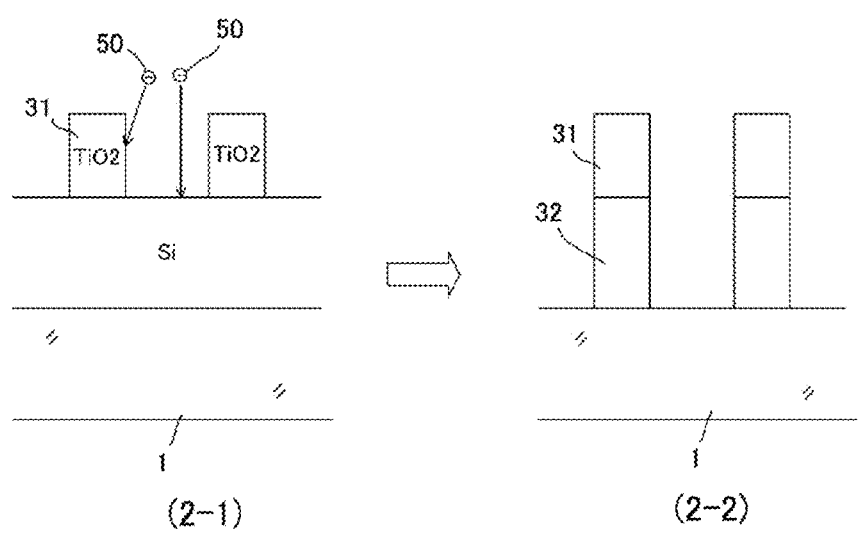

GRID POLARIZATION ELEMENT, AND OPTICAL ALIGNMENT DEVICE

TECHNICAL FIELD

The present invention relates to a polarization technology that uses a grid polarization element.

BACKGROUND ART

A polarization element that provides polarized light is known and used in various products and devices such as daily use products (e.g., polarizing sun glasses) as well as optical elements (e.g., polarization filters and polarization films). Also, the polarization element is often used in display devices such as a liquid crystal display. The polarization element is categorized into several groups, depending upon the manner of extracting the polarized light. One of such groups is a wire grid polarization element.

The wire grid polarization element includes a transparent substrate (or board) and a fine stripe-like grid formed on the transparent substrate, and the grid is formed from metal (conductor). The gap or distance between each two adjacent linear parts of the grid is designed to be smaller than the wavelength of the light to be polarized, and therefore the grid can serve as a polarization element (polarizer). Of the linearly polarized light, the polarized light that has an electric field component in the length direction of each linear part is reflected by the grid because the grid (polarization element) is equivalent to the flat metal, whereas the polarized light that has an electric field component in the direction perpendicular to the length direction of each linear part passes through the transparent substrate (polarization element) and exits from the polarization element because the grid is equivalent to only the transparent substrate. Thus, the linearly polarized light that has the electric field component in the direction perpendicular to the length direction of each linear part is only emitted from the polarization element. If the posture of the polarization element is controlled such that the length direction of each linear part of the grid is directed in a desired direction, then it is possible to obtain the polarized light that has the axis of the polarized light (direction of the electric field component) in a desired direction.

For the sake of description in the following passages, the linearly polarized light that has the electric field directed in the length direction of each linear part of the grid is referred to as "s polarized light" and the linearly polarized light that has the electric field directed in the direction perpendicular to the length direction of each linear part of the grid is referred to as "p polarized light." Generally, the light (wave) that has an electric field in the direction perpendicular to the incident plane (plane perpendicular to the reflection surface and including the incident light and the reflected light) is referred to as "s wave" and the light (wave) that has an electric field in the direction parallel to the incident plane is referred to as "p wave," but in this specification the terms "s polarized light" and "p polarized light" are used on the premise that the length direction of each linear part is perpendicular to the incident plane.

The basic indices that show the performances and characteristics of such polarization element include an extinction ratio ER and transmissivity (transmittance) TR. The extinction ratio ER is a ratio of the intensity of one polarized light passing through the polarization element to that of another polarized light passing through the polarization element, i.e., the ratio of the intensity of the p polarized light (Ip) to the intensity of the s polarized light (Is) (ER=Ip/Is). The transmissivity TR is a ratio of the energy of the p polarized light exiting from the polarization element to the total energy of the incident s polarized light and p polarized light (Iin) (TR=Ip/Iin). An ideal polarization element has the extinction ratio ER of ∞ (ER=∞) and the transmissivity of 50% (TR=50%).

It should be noted that the polarization element of the present invention is not limited to a grid that is made from the metal (wire). In the following description, therefore, the polarization element is simply referred to as a "grid polarization element."

LISTING OF REFERENCES

Patent Literature Documents

PATENT LITERATURE DOCUMENT 1: Japanese Patent Application Laid-Open Publication No. 2007-17762

SUMMARY OF THE INVENTION

Problems to be Solved by the Invention

In recent years, the above-described grid polarization element is used in the field of optical treatment or photo processing. One example of the photo processing is a photo alignment (optical alignment) technology that creates a film (alignment film), used to control the alignment of molecules, upon irradiation with the polarized light. The photo alignment is a technology that is often used in the process of manufacturing high-performance liquid crystal displays. This technology is a technology used to obtain the alignment film by the photo processing such that the prepared alignment film can arrange (align) the liquid crystal molecules in a certain direction relative to a substrate, or such that the prepared alignment film can arrange the liquid crystal molecules with a constant pre-tilt angle. The alignment film is prepared on (over) the liquid crystal substrate, and the liquid crystal molecule layer is disposed on the alignment film in order to control the arrangement (alignment) of the liquid crystal molecules. Before this technology is introduced, the alignment film is obtained by mechanical processing, which is called "rubbing." The photo alignment is now often used to improve the accuracy of the alignment and/or for other reasons because the photo alignment takes advantage of a fact that the material of the alignment film is sensitive to the light.

The grid polarization element can irradiate a relatively large area with the polarized light in a relatively uniform manner. If this feature is considered, therefore, the grid polarization element is suitable in the field of the photo processing such as the photo alignment. However, when the photo alignment is used, the wavelength of the light to which the material of the alignment film is sensitive is often the ultraviolet region (range), and therefore the polarization element that has sufficient characteristics and performances to the light of the ultraviolet region is needed. A wire grid polarization element, which is a typical example of the grid polarization elements, is not suitable for polarization of the light in the ultraviolet region.

It can be said that the wire grid polarization element is a reflection-type grid polarization element. The wire grid polarization element selectively reflects the s polarized light at the metallic grid, and selectively transmits the p polarized light only. However, when the light in the ultraviolet region is incident to the polarization element, the reflectance drops because the absorption occurs even if the material of the polarization element is the metal such as aluminum. Specifically, the frequency (oscillation) of the light approaches the plasma frequency of the free electrons in the metal, and therefore the reflectance of the light in the ultraviolet region drops even when the wire grid is made from the metal. Thus, the reflection-type grid polarization element that has, for example, an aluminum-made grid cannot provide sufficient polarization capability to the light in the ultraviolet region although the reflection-type grid polarization element is able to provide excellent polarization capability to the light in a visible region.

On the other hand, it is well known that the light in the ultraviolet region has a greater energy than the light in the visible region and the infrared region. Thus, the light in the ultraviolet region is often used in the field of the photo processing that changes the target substance (object to be processed) with regard to the characteristics and/or the shape of the target substance by the processing. Accordingly, if there is provided a polarization element that can provide sufficient polarization capability to the light in the ultraviolet region, its meaning is extremely significant.

With the above-mentioned things being considered, the inventor developed a grid polarization element that operates in a different model from a conventional reflection-type grid polarization element, i.e., the inventor developed an "absorption-type" grid polarization element. The absorption-type grid polarization element uses a light-absorbing material, such as a dielectric, as the material of the grid, and produces the polarization effect by taking advantage of the difference in the light absorption between the s polarized light and the p polarized light.

The grid polarization element may be satisfactory if the wavelength to be polarized is fixed (known) and the grid polarization element is expected to provide the polarization only at that particular wavelength. In other applications, however, it may be desired that the grid polarization element is able to provide the polarization at a plurality of different wavelengths, and/or in a wide range of wavelength. In the field of the photo processing, for example, a single photo processing device may have to handle different target substances and use different wavelengths for the different target substances (e.g., the materials of the target substances may have different exposure wavelengths or photosensitive wavelengths). In this case, if the single grid polarization element is only able to provide the necessary polarization at a particular wavelength, then a plurality of grid polarization elements should be prepared depending upon the target wavelengths. When the target substance changes, the grid polarization element should change correspondingly. This can increase the facility cost, and deteriorate the productivity because the grid polarization element is replaced with another grid polarization element.

Even if the grid polarization element possesses a high polarization capability, the high polarization capability may only be available in a very narrow wavelength region, and the polarization capability may steeply drop outside the narrow wavelength region. This can occur in the absorption-type grid polarization element when the spectral absorption capability of the material of the linear parts of the grid has a particular steep peak. On the other hand, the exposure wavelength may shift within a certain range because of, for example, irregularities in the physical properties of the target substances to be processed by the photo processing. It is desired that the qualities of the processing with the polarized light may not be affected even when there are some irregularities in the physical properties of the target substances. In other words, it is desired that the wavelength range in which the necessary polarization is obtained is made wider to a certain extent, and the grid polarization element is designed to irradiate the target substance with the polarized light in a relatively wide range of wavelength such that the processing qualities would not be affected even when there are some irregularities in the physical properties of the target substances. If the exposure wavelength of the target substance to be processed by the photo processing spans a wide wavelength region, it may be desired in terms of efficiency and other factors that the target substance is irradiated with the polarized light in the wide wavelength region.

If the high polarization capability of the grid polarization element is only available in a very narrow wavelength region, the grid polarization element tends to be affected by irregularities and tolerances in the manufacturing. In the grid polarization element, the dimensions and shapes of the respective linear parts of the grid, and the gap between each two adjacent linear parts are important in order to ensure sufficient polarization. However, it is physically impossible to prepare a grid polarization element with the dimensions and shape that perfectly match the designed values. In this case, if the designed polarization is only obtained in a narrow wavelength region, the actual polarization tends to be affected by the irregularities in the dimensions and shape at the time of manufacturing, and therefore qualities of a product (polarization qualities) may not be sufficiently stable.

From the above-mentioned points of view, it is possibly desired that the sufficient polarization is provided at a plurality of different wavelengths, and the sufficient polarization is provided in a wider region of wavelength. The present invention was developed with the above-mentioned points being taken into account. An object of the present invention is to provide a grid polarization element that can provide sufficiently high-quality polarization even in the ultraviolet region, such that the sufficient polarization is obtained at a plurality of different wavelengths or in a wider wavelength region.

Solution to the Problems

In order to solve the above-described problems, the invention according to claim 1 is directed to an absorption-type grid polarization element that includes a transparent substrate and a stripe-like grid disposed on the transparent substrate. The grid includes a plurality of linear parts made from materials that absorb light such that each linear part is configured to absorb first polarized light among incident light, which has a polarization axis directed in a particular direction, more than second polarized light, which has a polarization axis directed in a direction other than the particular direction, to achieve polarization.

Each of the linear parts has a first layer, which is made from a first material having its absorption peak at a first wavelength, and a second layer, which is made from a second material having its absorption peak at a second wavelength. The second wavelength is different from the first wavelength.

The transparent substrate is made from silica glass.

The second layer is a layer formed on the transparent substrate, and the second material is an amorphous silicon.

The first layer is a layer formed on the second layer, and the first material is an amorphous titanium oxide.

An extinction ratio obtained by a combination of the first layer and the second layer is equal to or greater than $1\times10^2$ in a wavelength range between 250 nm, inclusive, and 390 nm, inclusive.

In order to solve the above-described problems, the invention according to claim 2 is directed to an absorption-type grid polarization element that includes a transparent substrate and a stripe-like grid disposed on the transparent substrate. The grid includes a plurality of linear parts made from materials that absorb light such that each linear part is configured to absorb first polarized light among incident light, which has a polarization axis directed in a particular direction, more than second polarized light, which has a polarization axis directed in a direction other than the particular direction, to achieve polarization.

Each of the linear parts has a first layer, which is made from a first material having its absorption peak at a first wavelength, and a second layer, which is made from a second material having its absorption peak at a second wavelength. The second wavelength is different from the first wavelength.

The transparent substrate is made from silica glass.

The second layer is a layer formed on the transparent substrate, and the second material is an amorphous silicon.

The first layer is a layer formed on the second layer, and the first material is an amorphous titanium oxide.

A percentage of a thickness of the second layer to a total thickness of the first layer and the second layer is no smaller than 50% and less than 100%.

In order to solve the above-described problems, the invention according to claim 3 is directed to the absorption-type grid polarization element that has the configuration recited in claim 1 and also has a feature that a percentage of a thickness of the second layer to a total thickness of the first layer and the second layer is no smaller than 50% and less than 100%.

In order to solve the above-described problems, the invention according to claim 4 is directed to the absorption-type grid polarization element that has the configuration recited in claim 2 or 3 and also has a feature that a percentage of a thickness of the second layer to a total thickness of the first layer and the second layer is no smaller than 50% and no greater than 90%.

In order to solve the above-described problems, the invention according to claim 5 is directed to a photo alignment device that includes a light source and a grid polarization element of claim 1, 2, 3 or 4, and the grid polarization element is disposed between an irradiated area where a film material for photo alignment is placed and the light source.

Advantageous Effects of the Invention

As will be described below, the present invention can provide a high extinction ratio at any wavelength in a range from 250 nm, inclusive, to 390 nm, inclusive. Because the transparent substrate is made from silica glass, the first material is the amorphous titanium oxide, and the second material is the amorphous silicon, the present invention can enhance the mechanical strength of the grid and the shape stability of the grid, and can manufacture the gird with a high precision with regard to the shape of the grid.

The invention of claim 5 can provide the above-mentioned advantages, and can also apply the photo alignment processing to a film material. Because the grid polarization element can be used in various applications, it is possible to reduce the facility cost.

BRIEF DESCRIPTION OF THE DRAWINGS

FIG. 8 is a set of schematic views that are useful to describe the benefits of the grid polarization element of the embodiment in connection with the manufacturing process.

DESCRIPTION OF EMBODIMENTS

An embodiment of the present invention will now be described.

Figure 1:
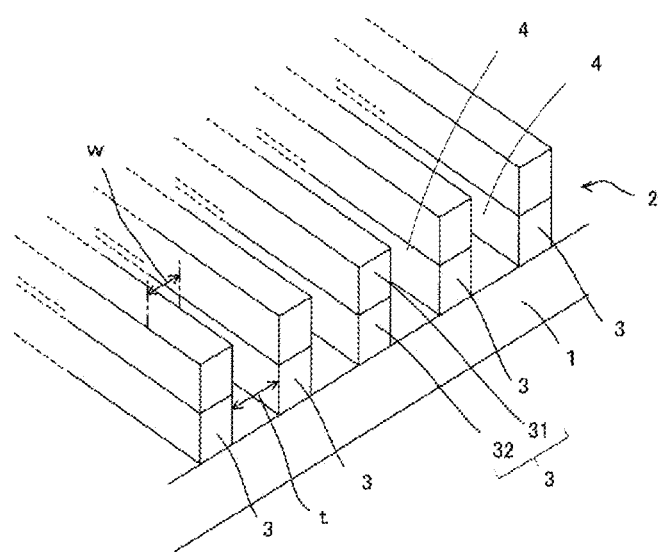
FIG. 1 is a schematic perspective view of a grid polarization element according to an embodiment of the present invention.

FIG. 1 is a schematic perspective view of a grid polarization element according to an embodiment. The grid polarization element shown in FIG. 1 includes, as its major components, a transparent substrate 1, and a grid 2 formed on the transparent substrate 1.

The transparent substrate 1 is "transparent" because the substrate has sufficient transmissivity to a target wavelength (wavelength of the light to be polarized by a polarization element). In this embodiment, the target wavelength is a wavelength of ultraviolet ray, and therefore the material of the transparent substrate 1 is silica glass (e.g., synthetic silica).

As shown in FIG. 1, the grid 2 has a stripe shape, which includes a plurality of linear parts 3 extending parallel to each other. The grid polarization element carries out the polarization because areas having different optical constants are arranged alternately and parallel. The spacing 4 between each two adjacent linear parts 3 is referred to as a "gap," and the combination of the linear parts 3 and the gaps 4 provide the polarization effect. The width W of each linear part 3 and the width t of each gap 4 are appropriately decided such that the light having the target wavelength is polarized by the grid polarization element.

The grid polarization element of this embodiment operates in accordance with a model of the absorption type. Specifically, each of the linear parts 3 of the grid has a first layer 31, which is made from a first material having its absorption peak at a first wavelength, and a second layer 32, which is made from a second material having its absorption peak at a second wavelength. The second wavelength is different from the first wavelength. Thus, the grid polarization element of this embodiment can polarize the light at two different wavelengths.

Figure 2:
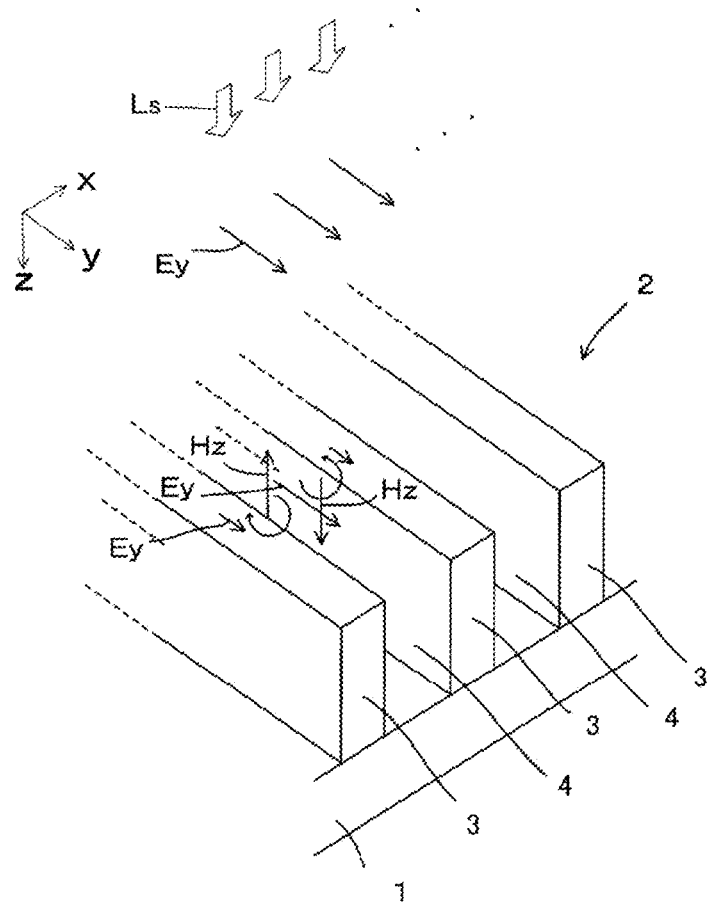
FIG. 2 is a schematic perspective view that shows an operation model of an absorption-type grid polarization element.

Firstly, the absorption-type grid polarization element will be described with reference to FIG. 2. FIG. 2 is a schematic perspective view of the operation model of the absorption-type grid polarization element. As described above, the grid polarization element is a polarizer that transmits the p polarized light and does not transmit the s polarized light. Thus, the behavior of the s polarized should primarily be discussed. For the sake of easier understanding, it should be assumed in the following that each of the linear parts 3 of the grid 2 is a single layer formed from a single material.

In FIG. 2, for the sake of description, the light propagates from the top toward the bottom of the drawing sheet, and this direction is referred to as the z-direction. The direction in which each of the linear parts 3 of the grid 2 extends is referred to as the y-direction. Thus, the s polarized light (indicated by "Ls" in FIG. 2) has an electric field component Ey. The magnetic field component of the s polarized light (not shown) extends in the x-direction ("Hx").

As the s polarized light approaches the grid 2 of the grid polarization element, the electric field Ey of the s polarized light is weakened by (in accordance with) the dielectric constant of the linear parts 3. On the other hand, the medium of the gap 4 is generally the air, and its dielectric constant is generally smaller than the dielectric constant of each linear part 3. Therefore, the electric field Ey is not weakened in the gap 4 very much as compared to in the grid 2.

As a result, a rotating component is derived from the electric field Ey in the x-y plane. Based on the Maxwell's equation (Equation (1)), which is shown below and corresponds to the Faraday's law of electromagnetic induction, the two magnetic fields Hz extending oppositely in the z-direction are induced depending upon the intensity of rotation in the x-y plane.

$$RotE = -\frac{\partial B}{\partial t} \quad (1)$$

Thus, there is a border at the highest point of the electric field Ey between the linear parts of the grid 2 (the middle point between the linear parts of the grid 2), and the magnetic field Hz on one side of the border is directed in the forward direction (directed in the same direction as the light propagation) whereas the magnetic field Hz on the other side is directed in the backward direction. Although not illustrated in FIG. 2, the magnetic field Hx in the x-direction has the same phase as the electric field Ey, and is directed in the negative direction of the x-axis. The magnetic field component Hx in the x-direction is pulled by the magnetic field Hz generated in the z-direction such that the magnetic field component Hx deforms like a wave.

Figure 3:
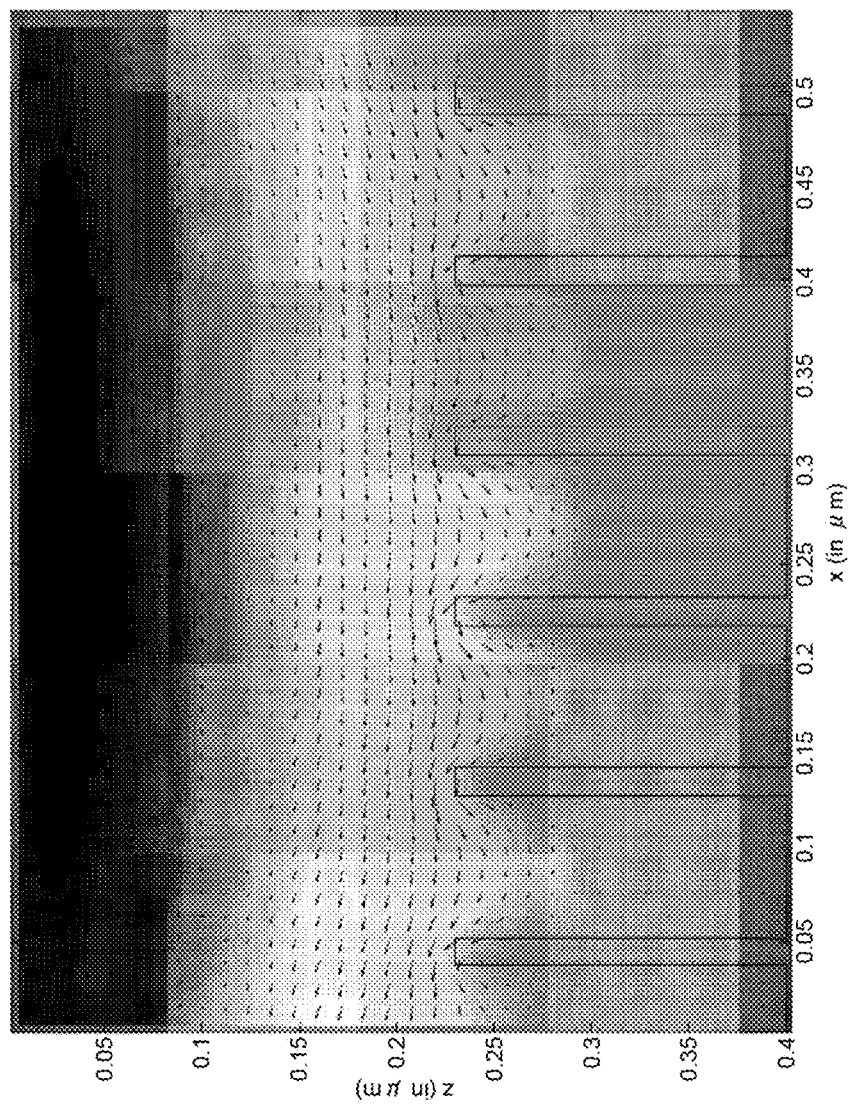
FIG. 3 shows a result of simulation experiments that confirmed the waving of a magnetic field component Hx in the x-direction.

FIG. 3 shows a result of simulation experiments that confirmed the waving of the magnetic field component Hx in the x-direction. FIG. 3 is obtained by the simulation with the grid 2 that has the linear parts 3 made from titanium oxide, with the optical constants (n=4.03, k=3.04) at the 365 nm wavelength. In FIG. 3, the width of each linear part 3 is 15 nm, the distance between each two adjacent linear parts 3 (gap) is the constant value, i.e., 90 nm, and the height of each linear part 3 is 170 nm. The simulation was carried out on the basis of the FDTD (Finite-Difference Time-Domain) method, and the software used in the simulation was MAT-LAB (registered trademark) of The Mathworks, Inc. (Massachusetts, USA).

In FIG. 3, the upper dark area (black area) represents the minus component of the electric field Ez, and the middle light area (gray area) represents the plus component of the electric field Ez. The magnetic field is indicated by vectors (arrows).

As shown in FIG. 3, it was confirmed that the s polarized light that has not yet reached the grid 2 has no Hz component and therefore the s polarized light has the Hx component only. It was also confirmed that as the s polarized light reaches the grid 2, the above-mentioned Hz component is generated and the magnetic field waves in the x-z plane. As understood from FIG. 3, it can be said that the waving of the magnetic field is the rotation of the magnetic field in the clockwise direction.

When the above-described waving (rotation) of the magnetic field component Hx occurs, an additional electric field is generated in the y-direction of FIG. 2 on the basis of the Maxwell's equation (Equation (2) below), which corresponds to the Maxwell-Ampere law.

$$RotH = j + \varepsilon \frac{\partial E}{\partial t} \quad (2)$$

Figure 4:
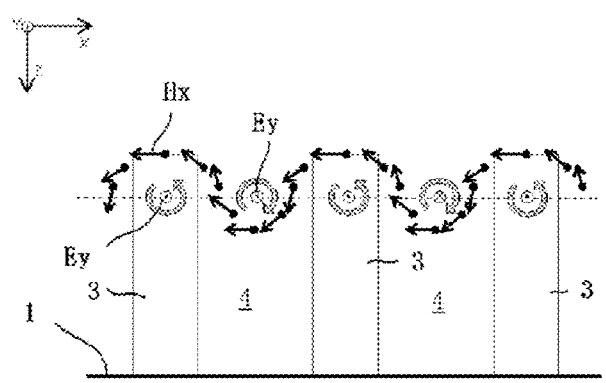
FIG. 4 is a schematic front cross-sectional view that shows an electric field Ey, which is newly generated upon the waving (rotation) of the magnetic field component Hx in the x-direction.

This is schematically depicted in FIG. 4. FIG. 4 is a schematic front cross-sectional view that shows an electric field Ey, which is newly generated upon the waving (rotation) of the magnetic field component Hx in the x-direction.

As shown in FIG. 4, the waving (rotation) of the magnetic field component Hx in the x-z plane generates the electric field Ey, which is directed toward a reader of this specification in the direction perpendicular to the drawing sheet of FIG. 2, inside each linear part 3, and generates another electric field Ey, which is directed in the direction opposite the direction of the electric field generated inside each linear part, in each gap 4. In this case, because the original electric field Ey of the incident s polarized light is directed toward a reader of this specification in the direction perpendicular to the drawing sheet, the electric field in the gap 4 is counterbalanced by the rotation of the above-mentioned magnetic field such that the waving of the magnetic field is disconnected and divided. As a result, the electric field Ey is localized in each of the linear parts 3 of the grid 2, the energy of the s polarized light is attenuated by the absorption, which is decided by the material of the linear parts 3, while the s polarized light is propagating through the grid 2.

On the other hand, the electric field component of the p polarized light is directed in the x-direction (Ex), but if it is looked at in the y-direction, the distribution of the dielectric constant is uniform. Thus, the rotating component of the electric field is, in effect, not generated. Accordingly, unlike the s polarized light, the localization of the electric field in the grid 2 does not occur, in effect, for the p polarized light and the disconnection (dividing) of the wave does not occur, in effect, for the p polarized light. As such, the p polarized light is only emitted from the transparent substrate 1, and the polarization effect is obtained. The absorption-type grid polarization element of this embodiment operates on the premise that the s polarized light and the p polarized light propagate in different manners because of the difference in the dielectric constant distribution in the space. It was also confirmed that even when the linear parts 3 of the grid 2 are made from a semiconductor material such as amorphous silicon, the s polarized light and the p polarized light propagate through the grid in different manners and the grid can provide the polarization effect.

Figure 5:
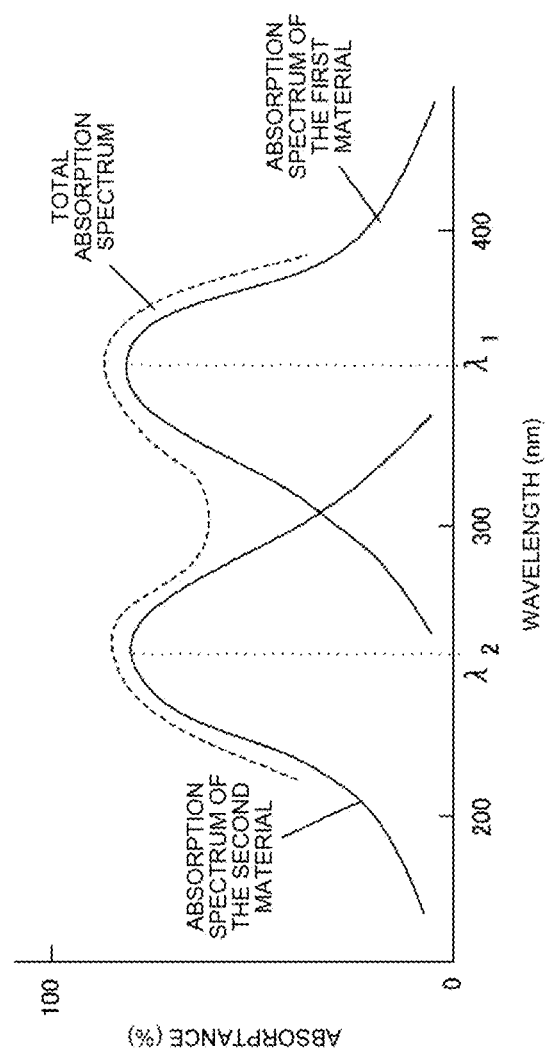
FIG. 5 is a schematic view that is useful to describe the meaning of a fact that the linear parts of the grid are made from two different light-absorbing materials.

The grid polarization element of this embodiment, which operates in the above-described absorption type model, includes the linear parts 3 such that each of the linear parts 3 has the two layers 31 and 32, i.e., the first layer and the second layer, as described above. This feature is significant because this feature can achieve the polarization at a plurality of wavelengths and/or achieve the polarization in a wider region of wavelength. This will be described with reference to FIG. 5. FIG. 5 is a schematic view that is useful to describe the meaning of a fact that the linear parts 3 of the grid 2 are made from two different light-absorbing materials.

As described above, the absorption-type operation model (behavior model) takes advantage of a fact that the electric field of the s polarized light is localized in the grid such that the s polarized light is absorbed and attenuated in each of the linear parts 3. Thus, each of the linear parts 3 is made from materials that absorb the light at the target wavelengths.

The absorption of the light in the ultraviolet region by (in) the substance takes place on the basis of the above-described model when the substance is metal (the absorption takes place because the plasma frequency of the free electrons becomes close to the frequency of the light), or in general, it takes place on the basis of the electron transition (particularly, the interband transition). In any event, the absorbing capability, i.e., the spectral absorption rate (absorptance), in the ultraviolet region varies with the material. In many cases, the absorptance reaches its peak at a particular wavelength. When the absorptance reaches its peak at a particular wavelength, the peak wavelength varies with the material. When the two materials, which have the different spectral absorption properties, are selected as the materials of the grid polarization element, as described above, then the spectral absorption properties are averaged, and the polarization that corresponds to the average spectral absorption property is obtained.

Advantages or benefits that result from the averaging of the spectral absorption properties include a first advantage that the polarization element has the two peak wavelengths of the absorptance and provides the good polarization at the two different wavelengths (polarization at a plurality of wavelengths) and a second advantage that the polarization element achieves the polarization in a relatively uniform manner in a wide range of wavelength (broadening of the polarization). Specifically, if the peak wavelength of the absorption by the first material is represented by $\lambda_1$ and the peak wavelength of the absorption by the second material is represented by $\lambda_2$ in FIG. 5, the absorption-type grid polarization element is able to efficiently function at both of the wavelengths $\lambda_1$ and $\lambda_2$ (polarization at a plurality of wavelengths). Because the absorption spectrum gradually decreases before and after each of the peak wavelengths, the total (combined) absorption spectrum draws a curve as indicated by the broken line in FIG. 5, and the polarization element provides a generally high absorptance over a range from $\lambda_1$ to $\lambda_2$, i.e., a relatively wide range of wavelength. In other words, when each of the linear parts 3 is formed from the first material layer 31 and the second material layer 32, it is possible to obtain the polarization over a range from $\lambda_1$ to $\lambda_2$, i.e., a relatively wide range of wavelength (broadening of the polarization). In the following, when the expressions "broad(er)," "to broaden" and "broadening" are used, they also include "polarization at a plurality of wavelengths." It should be noted that FIG. 5 schematically illustrates the polarization that is obtained with the two materials having the different absorption peak wavelengths, and does not show measurement data of the absorption spectrum of particular materials.

The polarizing action of the grid polarization element of this embodiment will now be described.

As described above, the grid polarization element of this embodiment is an absorption-type polarization element, and the polarization takes place because the s wave and the p wave of the incident polarized light are absorbed (attenuated) in different manners. During the absorbing, the light having the first wavelength is more absorbed by (in) the material of the first layer 31, and the above-described model of the absorption-type polarization occurs to the light (having the first wavelength) when the light propagates through the upper grid region, which is made from the first layer 31. When the light passes through the upper grid region and propagates through the lower grid region, which is made from the second layer 32, then the above-described model of the absorption-type polarization occurs to the light having the second wavelength, which is more absorbed by (in) the material of the second layer 32. As a result, the p polarized light is only emitted from the transparent substrate at the first and second wavelengths. Accordingly, the broad polarization is realized.

Specific examples of the materials are described. For example, amorphous titanium oxide may be used as the first material, and amorphous silicon may be used as the second material. Titanium oxide has a high absorptance at a wavelength equal to or less than 280 nm (in the UVC region, for example, 254 nm), and is suitable to polarize the light in this wavelength region. On the other hand, a material such as silicond and titanium nitride has a high absorptance in a wavelength region from 280 nm to 400 nm (in the UVA region and the UVB region), and is suitable to polarize the light in this wavelength region (e.g., 365 nm).

Figure 6:
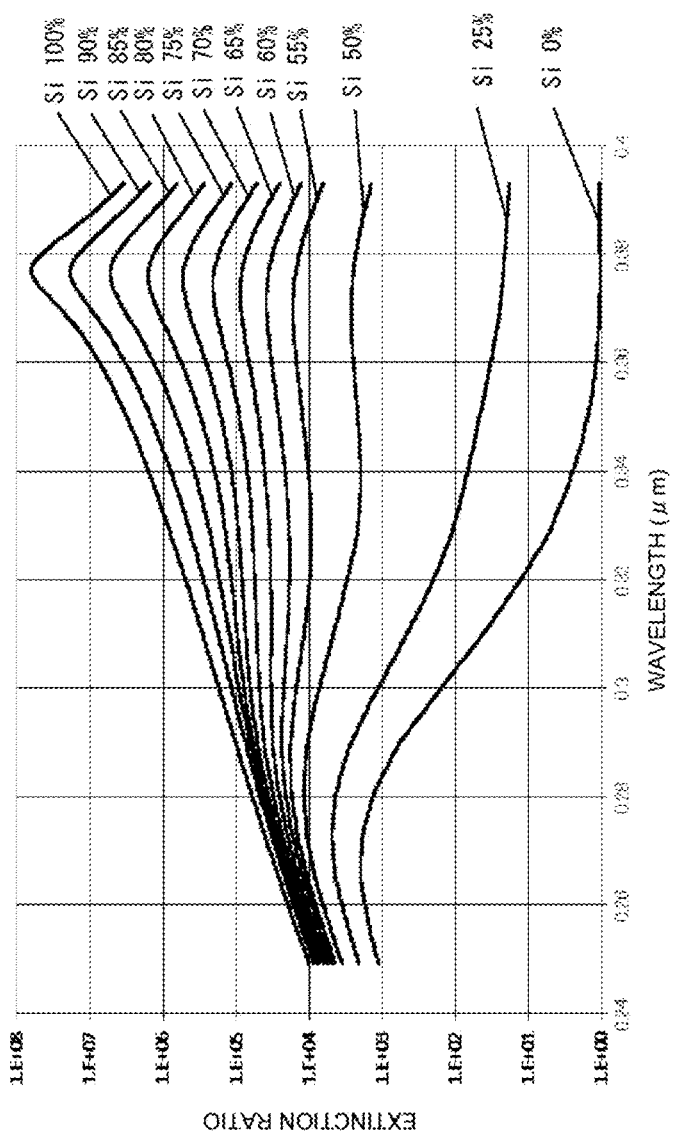
FIG. 6 shows a result of simulation experiments that confirmed the broadening of the polarization capability by the combination of titanium oxide and silicon.

FIG. 6 shows a result of simulation experiments that confirmed the broadening of the polarization capability by the combination of titanium oxide and silicon. In the simulation experiments, the polarization property was calculated by computation, with regard to a configuration that has the linear parts made from titanium oxide only and provided on the silica-made transparent substrate, a configuration that has the linear parts made from silicon only and provided on the silica-made transparent substrate, and a configuration that has the linear parts made from a titanium oxide layer and a silicon layer formed on the titanium oxide layer and provided on the silica-made transparent substrate. The simulation experiments were carried out on the premise that titanium oxide is amorphous and silicon is amorphous. Among the experiment data, the extinction ratios at various wavelengths are shown in FIG. 6. In the simulation, each of the linear parts has the fixed height, 200 nm, whereas the percentage of the height of the titanium oxide layer and the percentage of the height of the silicon layer in the linear part are changed. In FIG. 6, the percentage of the thickness (height) of the silicon layer is shown. In FIG. 6, "Si 100%" indicates that each linear part, which has a 200 nm height, is formed from silicon only, and "Si 95%" indicates that each linear part has a 190 nm of silicon layer and a 10 nm of titanium oxide layer. Similarly, "Si 0%" indicates that each linear part, which has a 200 nm height, is formed from titanium oxide only. The gap width between each two adjacent linear parts has a fixed value, 80 nm. The simulation was carried out with the RCWA (Rigorous Coupled-Wave Analysis) method, and used the software "Diffract-Mod" (product name) of RSOFT series, which is marketed from Japan Synopsys, Inc.

As shown in FIG. 6, when the linear parts having a 200 nm height are formed from titanium oxide only, a high extinction ratio is obtained in a wavelength region from about 250 nm to about 270 nm, but the extinction ratio gradually decreases in a wavelength region over that wavelength region. A very low extinction ratio is only obtained in a wavelength region over 350 nm. When the percentage of the silicon layer (height of the silicon layer) increases in each of the linear parts having the 200 nm height, then the extinction ratio gradually increases in a wavelength region over 270 nm, as shown in FIG. 6. When each of the linear parts is entirely formed from the silicon layer, there is obtained the polarization that has a peak value of the extinction ratio at or near 380 nm.

It is understood from the above-described results that when a portion of each linear part, which is made from titanium oxide, is replaced with silicon, the polarization effect is obtained in a wavelength region over 350 nm. In the wavelength region over 350 nm, substantially no polarization effect is obtained when the linear parts are entirely formed from titanium oxide. Thus, when a portion of each linear part, which is made from titanium oxide, is replaced with silicon, it is possible to obtain relatively uniform polarization effect in a wider region. In particular, when the silicon layer occupies 50% or more of the linear part, the extinction ratio of $1\times10^2$ or more is obtained at any wavelength between 250 nm and 390 nm. This is particularly desirable. It should be noted that data of the transmissivity (transmittance) among the polarization characteristics is not shown in the drawing, but it was confirmed that the transmissivity becomes more uniform in the wavelength range of about 250 nm-400 nm as a portion of each linear part is replaced with a silicon layer.

Figure 7:
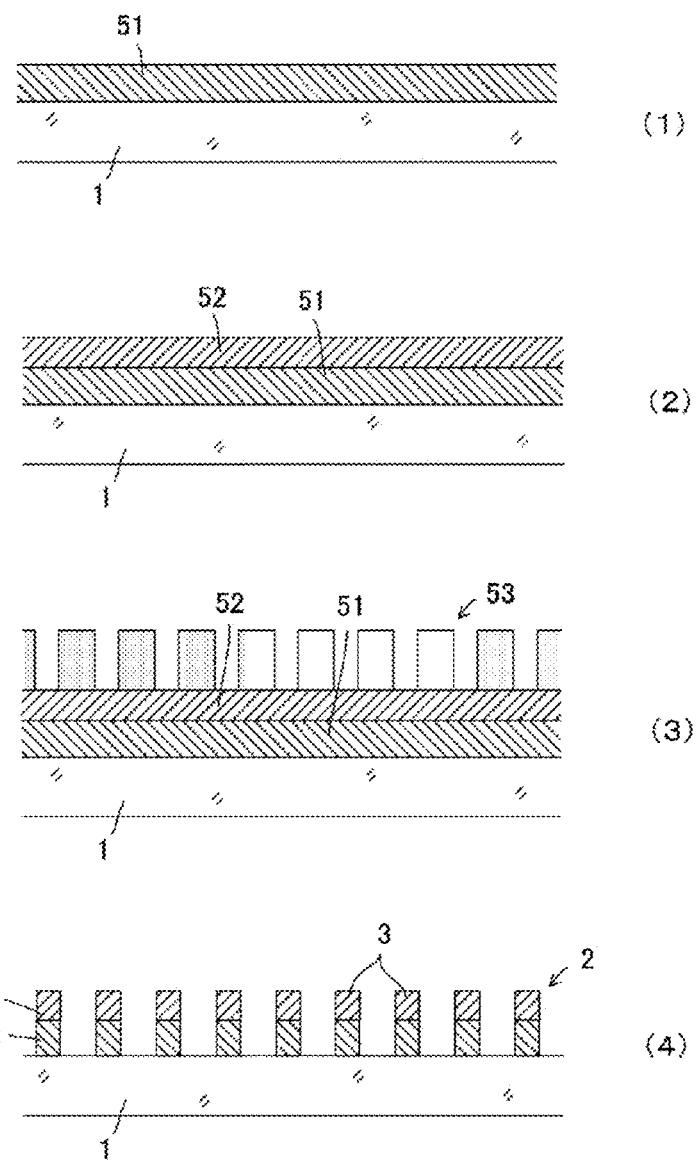
FIG. 7 is a set of schematic views showing a process of manufacturing a grid polarization element of the embodiment.

A method of manufacturing a grid polarization element according to the embodiment will be described with reference to FIG. 7. FIG. 7 is a set of schematic views showing a method of manufacturing a grid polarization element of the embodiment.

When the grid polarization element of this embodiment is manufactured, firstly, a silicon film 51 for the second layer 32 is formed on the silica-made transparent substrate 1 (FIG. 7(1)). A method for forming the silicon film may be any suitable method among various methods. For example, an ALD (Atomic Layer Deposition) method is used.

Subsequently, a titanium oxide film 52 for the second layer 32 is formed on the silicon film 51 (FIG. 7(2)). A method for forming the titanium oxide film may also be the ALD method. After that, a resist is applied on the titanium oxide film 52, and then the exposing, the developing and the etching are performed to form a resist pattern 53 (FIG. 12(3)). The resist pattern 53 has a shape corresponding to the shape of the grid to be formed, and has a stripe (line-and-space) shape.

The prepared resist pattern 54 is used as a mask, and the etching is performed with this mask such that the linear parts 3, each having the first layer 31 and the second layer 32, are formed (FIG. 7(4)). In this manner, the grid polarization element of this embodiment is prepared. Because the respective layers are made from the different materials, the etching is performed with different etchants, respectively. The etching performed here is dry etching, and the anisotropic etching is applied in the thickness direction of the transparent substrate 1. RIE (Reactive Ion Etching) or any other suitable method is employed.

The specific dimensions of the grid polarization element of this embodiment will be described. When the first layer 31 is made from titanium oxide and the second layer 32 is made from silicon, then the thickness of the first layer 31 is 50 nm and the thickness of the second layer is 150 nm. In this case, the total height of each linear part is 200 nm, and the width of each linear part is 30 nm. In this example, the width of the gap 4 is 80 nm.

The grid polarization element of this embodiment, which includes the first layers 31 made from titanium oxide and the second layers 32 made from silicon, possesses additional significant advantages in addition to the above-described advantages. Firstly, because the transparent substrate 1 of this embodiment is made from silica (quartz), the contact of the second layer 32 to the transparent substrate 1 is very close when the second layer 32 is made from silicon. Thus, the adhesion (contacting force) of the second layer to the transparent substrate 1 is enhanced. Accordingly, the mechanical strength and the shape stability of the grid are enhanced.

When the above-described manufacturing method is considered, the configuration that has the first layers 31 made from titanium oxide and the second layers 32 made from silicon possesses significant advantages and usefulness. This will be described with reference to FIG. 8. FIG. 8 is a set of schematic views that are useful to describe the advantages of the grid polarization element of the embodiment in connection with the manufacturing process.

In the grid polarization element of this embodiment, as described above, the titanium oxide film for the first layer 31 is formed over the silicon film for the second layer 31, and then the respective films undergo the etching to form the first layer 31 and the second layer 32. When RIE is used, as shown in FIG. 8, the ionized etchant 50 is accelerated in the electric field and is caused to collide, thereby carrying out the etching. In this process, because titanium oxide has a higher coupling energy (binding energy) than silicon, it is necessary to increase the electric field intensity and the etching of titanium oxide is performed with a higher ion striking (impact) energy.

If the first layer 31 is silicon and the second layer 32 is titanium oxide, as shown in FIG. 8(1-1), the silicon film is etched to form the stripe-like pattern, and then the ion striking (impact) energy is raised to apply the etching to the titanium oxide film. In this case, when the titanium oxide film is etched, the silicon of the upper first layer 31 also receives the ion striking at a high energy. Thus, the first layer 31 is severely or strongly scraped or cut before the etching to the titanium oxide film is finished (before the stripe-like second layer 32 is formed). As a result, as depicted in FIG. 8(1-2), the first layer 31 becomes a narrow (elongated) triangle when viewed in the cross-sectional view. This shape of the first layer is significantly different from the designed (expected) shape. As such, the polarization element may not be able to provide the expected polarization effect.

On the other hand, when the first layer 31 is titanium oxide and the second layer 32 is silicon, the above-described problem would not occur. Firstly the ion striking energy is raised, and the etching is applied to the titanium oxide film to form the first layer 31. Then, the ion striking energy is lowered (weakened), and the etching is applied to the silicon film 52, as shown in FIG. 8(2-1), to form the second layer 32. Because the coupling (binding) energy of titanium oxide is high and the ion striking energy is weak during the etching of the silicon film 52, titanium oxide of the upper first layer 31 is not scraped in a large amount. As shown in FIG. 8(2), therefore, a grid is formed with a shape that is not very much different from the designed shape. The configuration of this embodiment, in which the first layer 31 is titanium oxide and the second layer 32 is silicon, has a significant advantage, i.e., it is possible to manufacture the grid that has a highly precise shape, as described above.

It should be noted that when the percentage of the thickness of the first layer 31 and the percentage of the thickness of the second layer 32 are described in the foregoing, it is mentioned that the percentage of the second layer 32, which is silicon, is preferably equal to or greater than 50%, but the percentage of the second layer 32 is more preferably equal to or less than 90%. If the second layer 32 exceeds 90%, the thickness of the first layer 31, which is titanium oxide, becomes smaller than 10% (smaller than 20 nm in the above-described example). If the titanium oxide film for the first layer 31 is too thin, the waste (consumption) of the titanium oxide film becomes non-negligible during the etching of the silicon film for the second layer 32 even though the titanium oxide film is strong to the ion striking energy. Therefore, the percentage of the thickness of the silicon layer (second layer 31) to the total thickness is preferably equal to or less than 90%.

Figure 9:
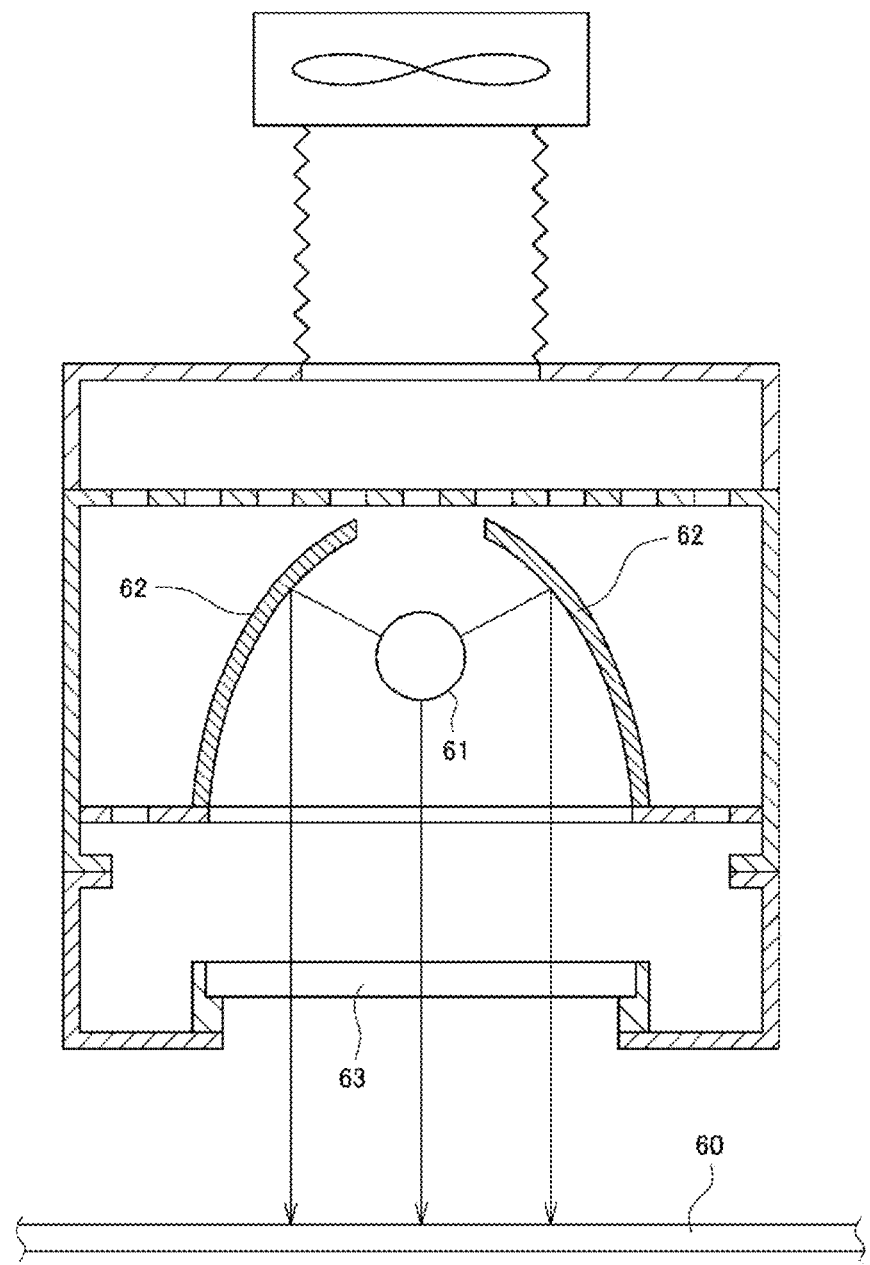
FIG. 9 illustrates an exemplary use of the grid polarization element of the embodiment, and is a schematic cross-sectional view of a photo alignment device that includes the grid polarization element.

Now, use of the above-described grid polarization element will be described. FIG. 9 illustrates an exemplary use of the grid polarization element of the embodiment, and is a schematic cross-sectional view of a photo alignment device that includes the grid polarization element.

The device shown in FIG. 9 is a photo alignment device configured to obtain a photo alignment film for the above-mentioned liquid crystal display, and irradiates a target object (workpiece) 60 with the polarized light to align the molecules of the workpiece 60 in a particular direction. Thus, the workpiece 60 is a film (film material) for the photo alignment film, e.g., a sheet made from polyimide. When the workpiece 60 is a sheet, a roll-to-roll transport system is employed, and the workpiece is irradiated with the polarized light during the transporting. If a liquid crystal substrate, which is covered with a film material for the photo alignment, is the workpiece, then the liquid crystal substrate may be placed on a stage to transport the liquid crystal substrate, or the liquid crystal substrate may be transported by a conveyor.

The device shown in FIG. 9 includes a light source 61, mirrors 62 extending behind the back face of the light source 61, and a grid polarization element 63 located between the light source 61 and the workpiece 6. The grid polarization element 63 is a grid polarization element of the above-described embodiment.

The light source 61 is an ultraviolet lamp such as a high-pressure mercury lamp, as mentioned above. The light source 61 is a component that is elongated in a direction perpendicular to the transport direction of the workpiece 60 (in a direction perpendicular to the drawing sheet).

The grid polarization element 63 transmits the p polarized light in a selective manner, in the longitudinal direction of each of the linear parts, as described above. Thus, the position and the posture of the grid polarization element 63 are precisely decided and fixed relative to the workpiece 60 such that the polarization axis of the p polarized light extends in the direction of the photo alignment.

It should be noted that it is difficult to manufacture a large grid polarization element. Therefore, when a large area should be irradiated with the polarized light, a plurality of grid polarization elements are arranged in a single plane. In this case, the plane on which a plurality of grid polarization elements are arranged is parallel to the surface of the workpiece 60, and the grid polarization elements are arranged such that the longitudinal direction of each of the linear parts of each of the grid polarization elements extends in a predetermined direction relative to the workpiece 60.

As described above, the grid polarization element 63 is the absorption-type grid polarization element that includes the first and second layers 31 and 32 formed from the materials having different absorption wavelength regions. Thus, the gird polarization element 63 can provide the polarized light in a broad wavelength region. This feature is meaningful and significant because the photo alignment device can be used in a variety of applications (versatility of the photo alignment device is enhanced), and a device user can reduce or save a facility investment. Specifically, when different types of alignment films are used, polarized light having different wavelengths should be emitted. Then, a conventional photo alignment device needs to use a plurality of grid polarization elements for the respective wavelengths. On the other hand, the grid polarization element of this embodiment has a broad wavelength region, and therefore the sole (same) grid polarization element may be used for the different types of alignment films. When the single grid polarization element is able to process the different alignment films, the device user can correspondingly save the facility investment.

It should be noted that it goes without saying that the above-mentioned advantages are generally obtained in the photo processing that requires the polarized light in different wavelength regions depending upon an object to be processed, other than the photo alignment.

REFERENCE NUMERALS AND SYMBOLS

1: Transparent substrate
2: Grid
3: Linear part
31: First layer
32: Second layer
4: Gap
60: Workpiece
61: Light source
62: Mirror
63: Grid polarization element

The invention claimed is:

1. An absorption-type grid polarization element comprising a transparent substrate and a stripe-like grid disposed on the transparent substrate, the grid including a plurality of linear parts made from materials that absorb light, each said linear part being configured to absorb first polarized light among incident light, which has a polarization axis directed in a particular direction, more than second polarized light, which has a polarization axis directed in a direction other than said particular direction, to achieve polarization,
  each said linear part having a first layer, which is made from a first material having its absorption peak at a first wavelength, and a second layer, which is made from a second material having its absorption peak at a second wavelength, the second wavelength being different from the first wavelength,
  the transparent substrate being made from silica glass,
  the second layer being a layer formed on the transparent substrate, and the second material being an amorphous silicon,
  the first layer being a layer formed on the second layer, and the first material being an amorphous titanium oxide, and
  an extinction ratio obtained by a combination of the first layer and the second layer being equal to or greater than $1 \times 10^2$ in a wavelength region between 250 nm, inclusive, and 390 nm, inclusive.

2. An absorption-type grid polarization element comprising a transparent substrate and a stripe-like grid disposed on the transparent substrate, the grid including a plurality of linear parts made from materials that absorb light, each said linear part being configured to absorb first polarized light among incident light, which has a polarization axis directed in a particular direction, more than second polarized light, which has a polarization axis directed in a direction other than said particular direction, to achieve polarization, each said linear part having a first layer, which is made from a first material having its absorption peak at a first wavelength, and a second layer, which is made from a second material having its absorption peak at a second wavelength, the second wavelength being different from the first wavelength, the transparent substrate being made from silica glass, the second layer being a layer formed on the transparent substrate, and the second material being an amorphous silicon, the first layer being a layer formed on the second layer, and the first material being an amorphous titanium oxide, and a percentage of a thickness of the second layer to a total thickness of the first layer and the second layer being no smaller than 50% and less than 100%.

3. The grid polarization element according to claim 1, wherein a percentage of a thickness of the second layer to a total thickness of the first layer and the second layer is no smaller than 50% and less than 100%.

4. The grid polarization element according to claim 2, wherein the percentage of the thickness of the second layer to the total thickness of the first layer and the second layer is no smaller than 50% and no greater than 90%.

5. A photo alignment device comprising a light source and at least one grid polarization element of claim 1, the at least one grid polarization element being disposed between an area where a film material for photo alignment is placed and the light source.

6. The grid polarization element according to claim 3, wherein the percentage of the thickness of the second layer to the total thickness of the first layer and the second layer is no smaller than 50% and no greater than 90%.

7. The grid polarization element according to claim 1, wherein the first polarized light is s polarized light and the second polarized light is p polarized light.

8. The grid polarization element according to claim 2, wherein the first polarized light is s polarized light and the second polarized light is p polarized light.

9. The grid polarization element according to claim 1, wherein the first wavelength is 280 nm and the second wavelength is 365 nm.

10. The grid polarization element according to claim 2, wherein the first wavelength is 280 nm and the second wavelength is 365 nm.

11. The photo alignment device according to claim 5 further comprising a mechanism for transporting the workpiece relative to the grid polarization element.

12. The photo alignment device according to claim 5, wherein said at least one polarization element includes a plurality of polarization elements arranged in parallel to the film material.

13. The photo alignment device according to claim 5, wherein said light source is an ultraviolet lamp.

\* \* \* \* \*